(12) United States Patent
Koste et al.

(10) Patent No.: US 7,912,328 B2
(45) Date of Patent: Mar. 22, 2011

(54) OPTICAL WAVEGUIDE EMI SHIELD

(75) Inventors: Glen Peter Koste, Niskayuna, NY (US);
Michael Joseph Schutten, Rotterdam, NY (US); Arthur Vorwerk Radun, Mason, OH (US)

(73) Assignee: General Electric Company, Niskayuna, NY (US)

( * ) Notice: Subject to any disclaimer, the term of this patent is extended or adjusted under 35 U.S.C. 154(b) by 69 days.

(21) Appl. No.: 12/315,037

(22) Filed: Nov. 26, 2008

(65) Prior Publication Data

US 2010/0128454 A1    May 27, 2010

(51) Int. Cl.
*G02B 6/12* (2006.01)
*H05K 9/00* (2006.01)
(52) U.S. Cl. .......................................... 385/14; 361/818
(58) Field of Classification Search .................... 385/14; 361/818
See application file for complete search history.

(56) References Cited

U.S. PATENT DOCUMENTS

| | | | |
|---|---|---|---|
| 6,856,769 B1 * | 2/2005 | Steffensen et al. | 398/135 |
| 6,928,205 B2 | 8/2005 | Ouchi | 385/14 |
| 7,068,522 B2 | 6/2006 | Aronson et al. | 361/818 |
| 7,120,325 B1 | 10/2006 | Uchida | 385/14 |
| 7,217,043 B2 | 5/2007 | Schunk | 385/94 |
| 7,271,461 B2 | 9/2007 | Dutta | 257/432 |
| 7,286,372 B2 | 10/2007 | Aronson et al. | 361/818 |
| 7,306,689 B2 | 12/2007 | Okubora et al. | 156/239 |
| 7,313,294 B2 | 12/2007 | Hsu | 385/14 |
| 7,336,863 B2 | 2/2008 | Cohen et al. | 385/14 |
| 7,349,592 B2 | 3/2008 | Iwasaki | 385/14 |
| 2006/0072871 A1 | 4/2006 | Uchida | 385/14 |
| 2007/0080458 A1 * | 4/2007 | Ogawa et al. | 257/750 |

* cited by examiner

*Primary Examiner* — Jerry Blevins
(74) *Attorney, Agent, or Firm* — Penny A. Clarke (57) ABSTRACT

A circuit board assembly is configured to attenuate and prevent electro-magnetic fields from interfering with operation below a desired cutoff frequency, of electro-magnetic interference (EMI) susceptible circuit board electronics disposed within a shielded enclosure, while allowing signals to be transmitted between the EMI susceptible circuit board electronics at frequencies below the desired cutoff frequency, and circuits or devices external to the shielded enclosure.

18 Claims, 6 Drawing Sheets

OPTICAL WAVEGUIDE EMI SHIELD

BACKGROUND

The invention relates generally to EMI filtering and more particularly to a method of combining optical waveguides with standard circuit board elements to create an electromagnetic interference (EMI) shield with a means for transmitting signals through the shield barrier optically.

Circuit board assemblies often contain circuits that are susceptible to EMI, such as microprocessors, in close proximity to EMI generating circuits, such as microwave amplifiers, or circuits corrupted by EMI from external sources, such as power switches connected to external loads. These problems have generally been addressed by constraining the location of the susceptible circuits on the circuit board(s) to areas far removed from the EMI generating circuits or wires. These problems have also been addressed by shielding the susceptible circuits and using filtered connections for signaling from these circuits. Yet another technique that has been employed is placement of the susceptible circuits entirely on a separate card assembly. Although the foregoing techniques each provide corresponding advantages, each of these techniques significantly constrains the associated circuit design and may not provide entirely effective shielding of the susceptible circuits from interference. A challenge not yet met by known techniques is the need for shielding susceptible circuits to high frequency EMI (up to about 40 GHz) while providing a means for signaling between the susceptible circuits and external devices.

In view of the above, it would be both advantageous and beneficial to provide an effective high frequency EMI shield for standard circuit board assemblies/elements that allows signals generated via the standard circuit board assemblies/elements to effectively pass through the EMI shield barrier while shielding high frequency EMI.

BRIEF DESCRIPTION

Briefly, in accordance with one embodiment, a circuit board assembly comprises:

at least one electro-magnetic (EM) waveguide configured to attenuate and prevent electro-magnetic fields below a desired cutoff frequency from interfering with operation of electro-magnetic interference (EMI) sensitive circuit board electronics below the desired cutoff frequency; and at least one optical waveguide configured to pass optical signals transmitted to and from the EMI sensitive circuit board electronics, the optical signals passing through both the at least one optical waveguide and the at least one electro-magnetic waveguide at frequencies below the desired cutoff frequency.

According to another embodiment, a circuit board assembly comprises:

a printed circuit board (PCB) configured to prevent electro-magnetic fields from passing through the PCB;

at least one shielded enclosure disposed on the PCB and configured to shield electro-magnetic interference (EMI) susceptible PCB electronics disposed on the PCB from exposure to EMI;

at least one electro-magnetic (EM) waveguide passing through at least one of the PCB or the at least one shielded enclosure and configured to attenuate and prevent EM fields below a desired cutoff frequency from interfering with operation of the EMI susceptible circuit board electronics disposed within the at least one shielded enclosure; and at least one optical waveguide passing through at least one EM waveguide and configured to pass optical signals transmitted to and from the EMI susceptible circuit board electronics, the optical signals passing through both the at least one optical waveguide and the at least one EM waveguide at frequencies below the desired cutoff frequency.

According to yet another embodiment, a circuit board assembly is configured to attenuate and prevent electro-magnetic fields from interfering with operation below a desired cutoff frequency, of electro-magnetic interference (EMI) susceptible circuit board electronics disposed within a shielded enclosure, while allowing signals to be transmitted between the EMI susceptible circuit board electronics at frequencies below the desired cutoff frequency, and circuits or devices external to the shielded enclosure.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Many circuit boards contain circuits that are susceptible to EMI, in close proximity to EMI generating circuits/devices, or circuits corrupted by EMI from external sources. The challenge is shielding the susceptible circuits from a broad frequency range of EMI (e.g. up to about 40 GHz) while providing a means for high frequency signaling between the susceptible circuits and external devices, such as stated above.

Figure 1:
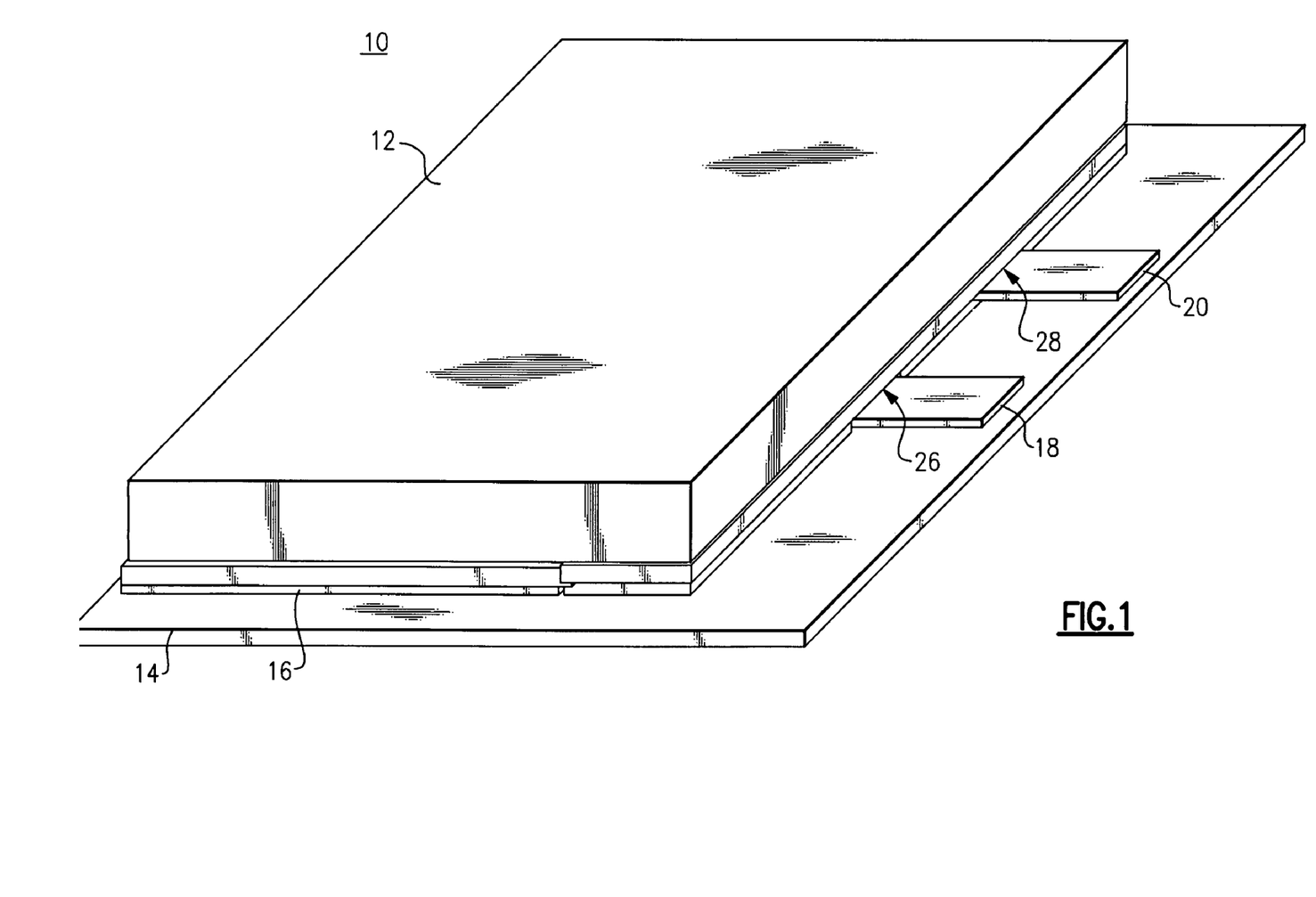
FIG. 1 illustrates one portion of a circuit board assembly with an EMI shield, according to one embodiment of the invention.

FIG. 1 illustrates one portion of a circuit board assembly 10 with an EMI shield 12, according to one embodiment of the invention. The circuit board assembly 10 includes an area disposed on a ground plane 14 that is bounded by a thick layer of copper 16. A conducting cover forms a seal with the copper boundary 16 to provide the EMI shield 12 and prevent EMI from reaching EMI susceptible circuits/devices inside the conducting cover/EMI shield 12. Openings between the copper boundary 16 and the conducting cover/EMI shield 12 are each configured as an EMI waveguide 26, 28 with opening dimensions adjusted to attenuate and prevent EM field frequencies below a desired cutoff frequency (e.g. about 40 GHz) from passing through the corresponding EMI waveguide openings 26, 28 and reaching the susceptible circuits and/or devices. Optical waveguides 18, 20 pass through the openings 26, 28 respectively to allow the circuits and/or devices inside the EMI shield 12 to communicate with external circuits/devices. Each optical waveguide 18, 20 is configured to pass optical signals at frequencies below the desired cutoff frequency through its corresponding EMI waveguide 26, 28.

The embodiments described herein with reference to the figures advantageously provide for much more compact circuit board assemblies than that achievable using known EMI shielding techniques. Other advantages provided by the described embodiments include the removal of constraints on part(s) placement within circuit boards or subsystems, and a much high level of EMI protection for circuit board electronics.

Figure 2:
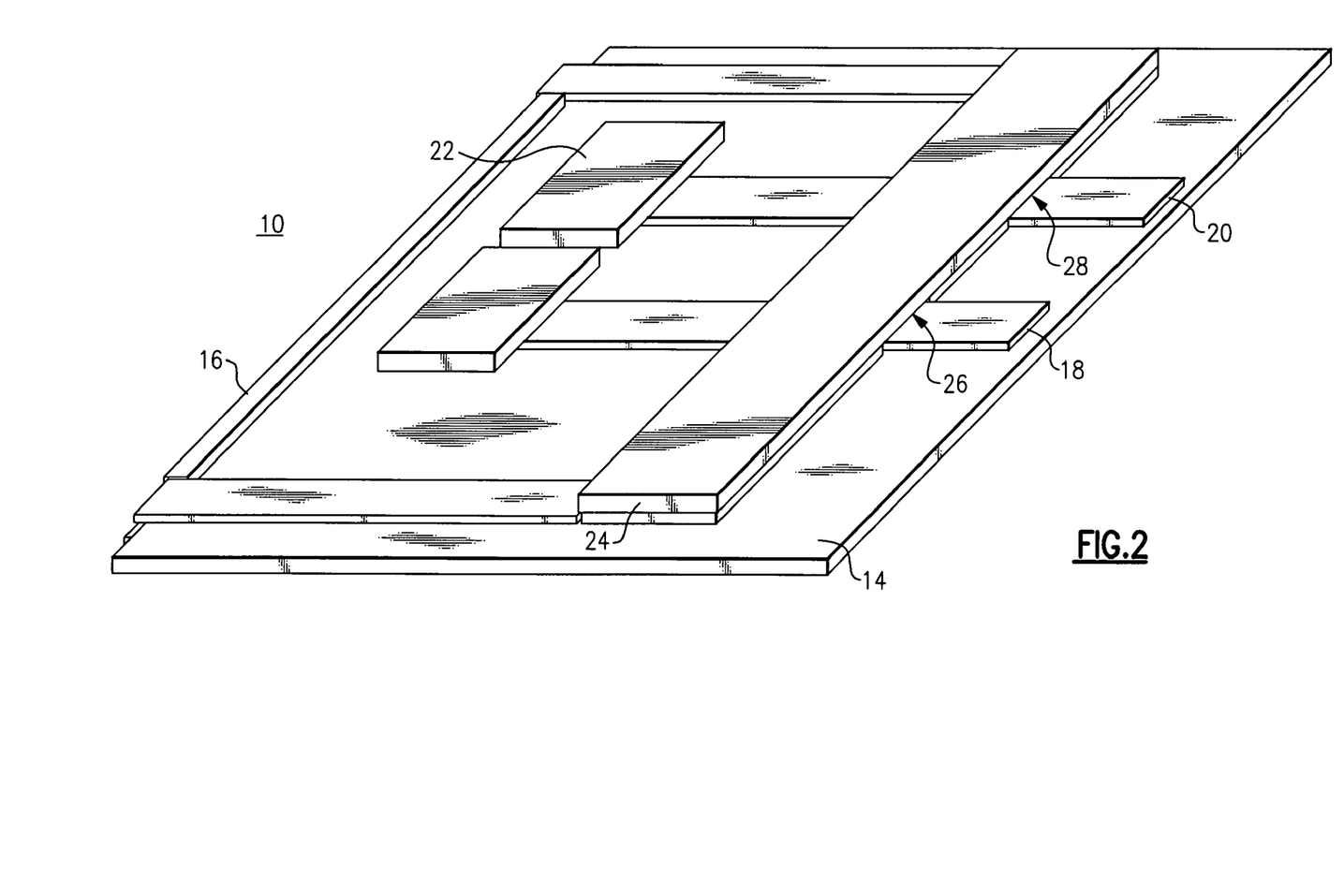
FIG. 2 illustrates EMI sensitive electronics disposed within the EMI shield shown in FIG. 1, according to one embodiment of the invention.

FIG. 2 illustrates circuit board assembly 10 without the EMI shield 12 to illustrate EMI sensitive electronics 22 disposed within the EMI shield 12 shown in FIG. 1, according to one embodiment of the invention. Circuit board assembly 10 includes a printed circuit board with vias (not shown) and a ground plane 14. A conducting shim 24 is positioned to provide a continuous seal between the EMI shield 12 and the portion of the copper boundary 16 that is configured with openings 26, 28. Together, the conducting shim 24, the copper boundary openings, and the ground plane 14 form the EMI waveguides 26, 28 configured with opening dimensions adjusted to significantly attenuate unwanted EM fields. Optical waveguides 18 and 20 passing through the EMI waveguides 28 and 28 respectively, provide a pathway for electrical communication signals between the EMI sensitive electronics 22 and circuits/devices external to the EMI shield 12. The optical waveguides 18, 20 may optionally be replaced with optical fiber, requiring additional space on the circuit board. Further, the optical signals could be transmitted through an optically clear, but electrically conductive material, if optical losses are not a factor in the design. Although each EMI waveguide has been described above as accommodating a single optical waveguide, the present invention is not so limited. Several optical waveguides can be placed within one EMI waveguide to accommodate a plurality of signal frequencies below the desired cutoff frequency.

In summary explanation, electro-magnetic waveguides 26, 28 are each configured to prevent EM field signals at frequencies below a desired cutoff frequency from interfering with operation of sensitive circuit board electronics. The EM waveguides 26, 28 are configured with opening dimensions adjusted to significantly attenuate unwanted EM fields using standard circuit board design techniques. One or more of the EM waveguides 26, 28 are filled with one or more respective optical waveguides 18, 20 for signaling between the EMI protected susceptible electronics and the outside.

Figure 3:
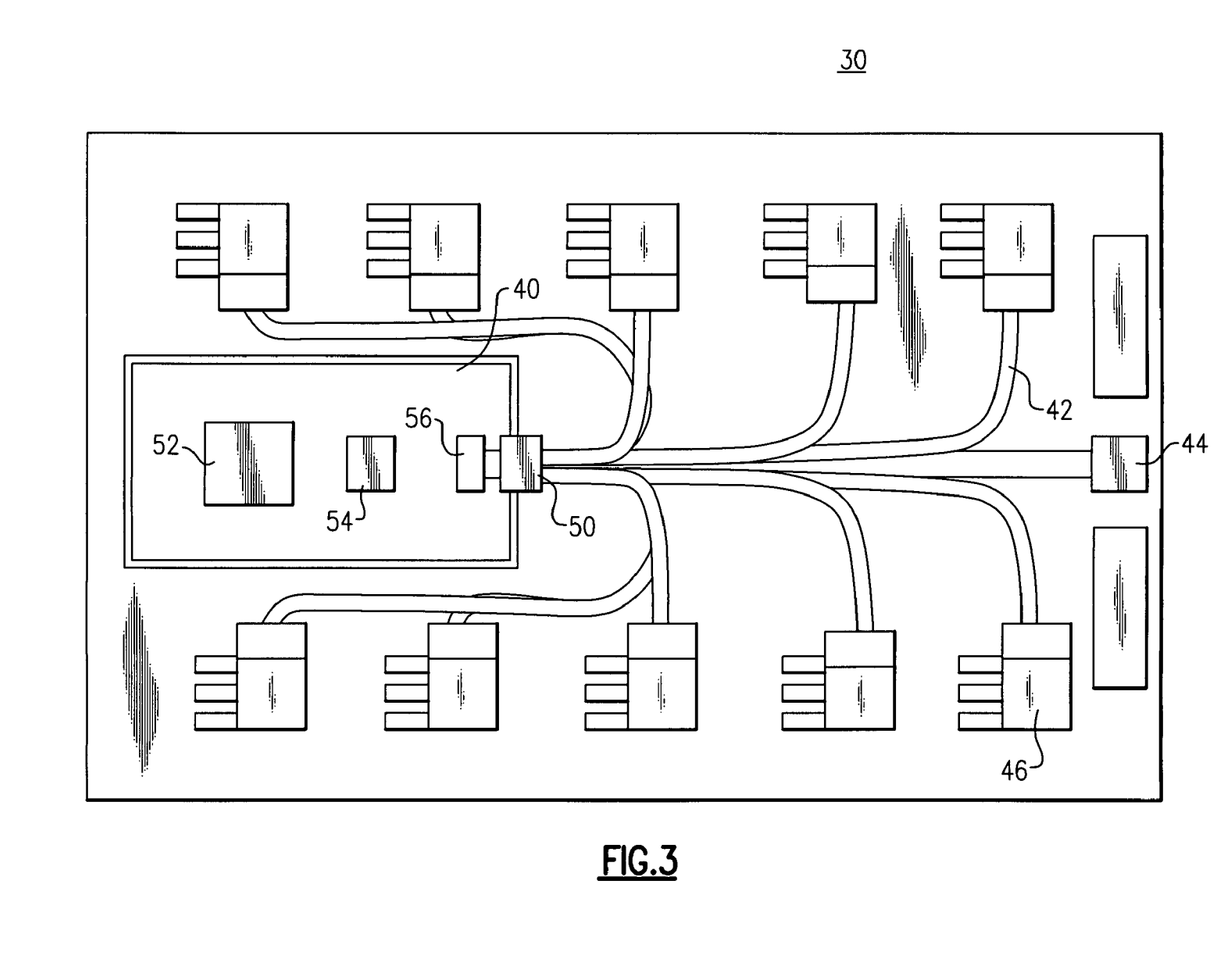
FIG. 3 illustrates a complete circuit board assembly that includes an EMI shield including EMI sensitive electronics disposed therein, according to one embodiment of the invention.

FIG. 3 illustrates a complete circuit board assembly 30 that includes an EMI shield 40 including EMI sensitive electronics disposed therein, according to one embodiment of the invention. EMI shield 40 includes an EMI waveguide 50 configured with opening dimensions adjusted to significantly attenuate unwanted EM fields below a desired cutoff frequency from interfering with operation of the EMI sensitive electronics 52, 54. An optical waveguide assembly 42 is configured to pass optical signals through the EMI waveguide at frequencies below the desired cutoff frequency while simultaneously allowing the EMI waveguide 50 to attenuate unwanted EM fields below the desired cutoff frequency. Optical connector 56 provides an optical signal link between the EMI sensitive electronics 52, 54 and circuit board assembly components 46 external to the EMI shield 40 via the optical waveguide assembly 42. Optical connector 44 in combination with optical connector 56 provides an optical signal link between the EMI sensitive electronics 52, 54 and electronics external to the complete circuit board assembly 30 via the optical waveguide assembly 42.

Figure 4:
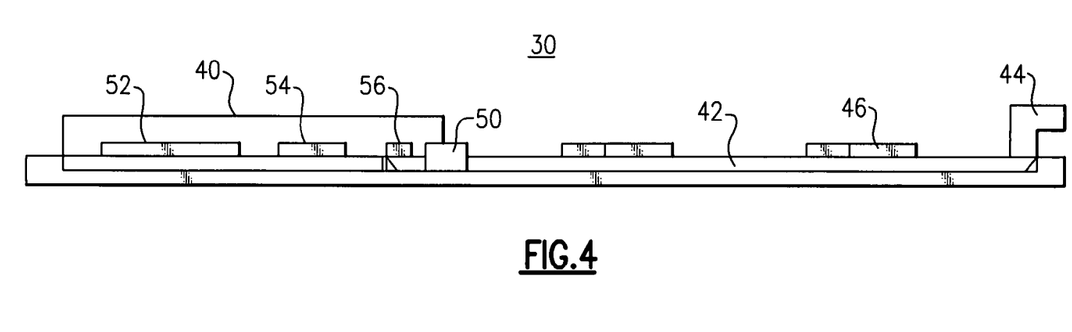
FIG. 4 is a side view of the circuit board assembly illustrated in FIG. 3.

FIG. 4 is a side view of the circuit board assembly 30 illustrated in FIG. 3 and shows the EMI sensitive electronics 52, 54 protected by the EMI shield 40 and EMI waveguide 50. Optical waveguide assembly 42 passes through the EMI waveguide 50 to provide the optical signal link between the EMI sensitive electronics 52, 54 and electronics external to the EMI shield 40 via optical connectors 44 and 56 respectively.

Figure 5:
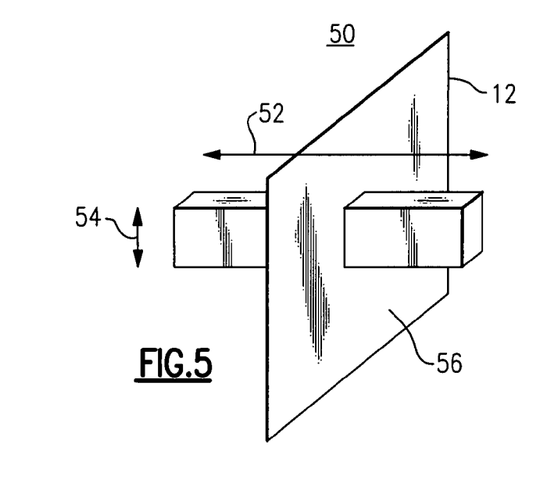
FIG. 5 illustrates an EMI attenuation waveguide, according to one embodiment of the invention.

FIG. 5 illustrates an EMI attenuation waveguide 50, according to one embodiment of the invention. EMI waveguide 50 is configured with length 52 (typically 5 mm) and width 54 (typically 1 mm) opening dimensions adjusted to significantly attenuate unwanted EM fields below a desired cutoff frequency on one side 56 of the EMI attenuation waveguide 50 from interfering with operation of the EMI sensitive electronics 52, 54 on the opposite side 54 of the EMI attenuation waveguide 50. The EMI attenuation waveguide 50 is electrically bonded at its outer perimeter to the EMI shield 12.

Figure 6:
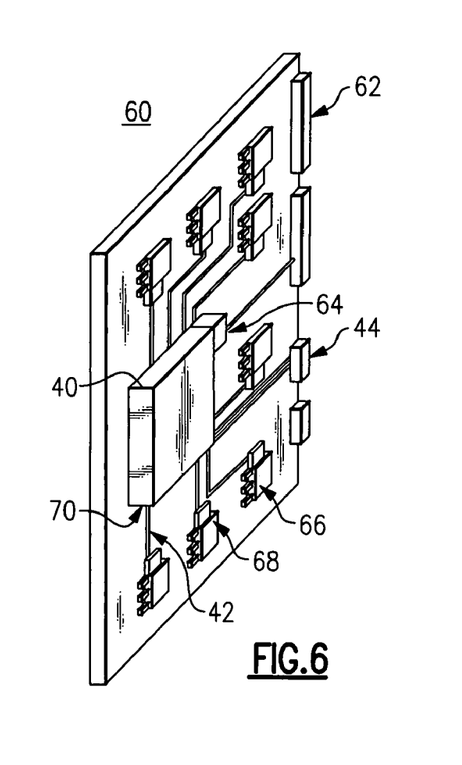
FIG. 6 illustrates a backplane insertable power switch circuit card assembly that includes an EMI shield and EMI sensitive electronics, according to one embodiment of the invention.

FIG. 6 illustrates a backplane insertable power switch circuit card assembly 60 that includes shielded digital electronics and optical input/output ports 40, according to one embodiment of the invention. Shielded digital electronics 40 include a plurality of EMI waveguides 70 and corresponding optical waveguides or optical fibers 42. According to one aspect, assembly 60 further includes an optical sense/controls 68, hardened power switches 66, and one or more power supply filters 64. An optical backplane connector 44 is configured to interconnect with a mating optical backplane connector disposed within a power distribution controller card cage 82 described below with reference to FIG. 7. One or more backplane power connectors disposed with the power distribution controller card cage 82 is configured to interconnect with one or more card assembly power connectors 62.

Figure 7:
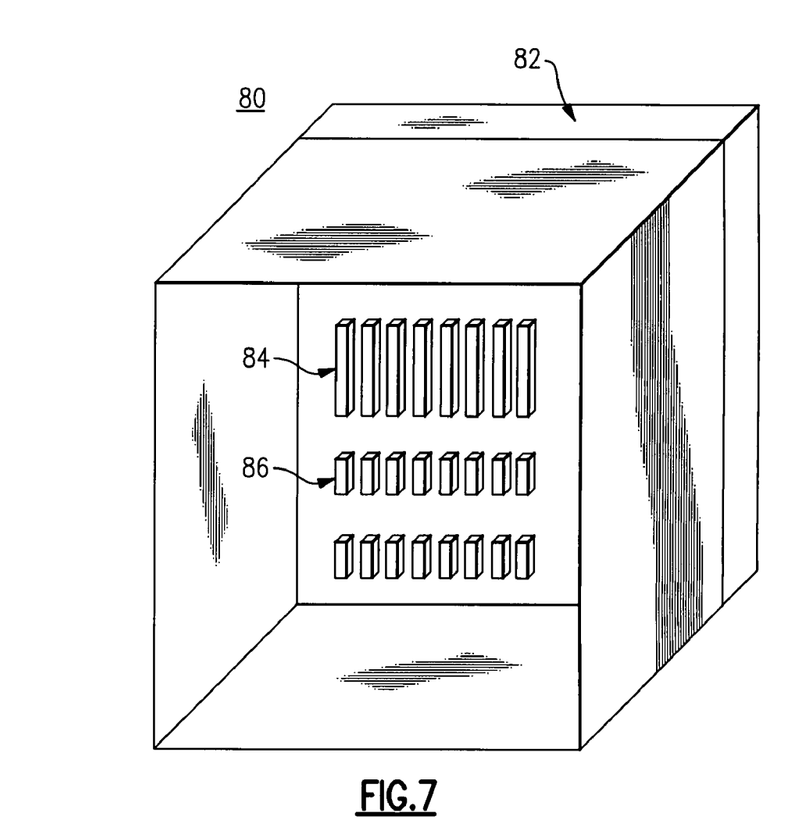
FIG. 7 illustrates a power distribution controller card cage configured to receive the backplane insertable power switch circuit card assembly shown in FIG. 6, according to one embodiment of the invention.

FIG. 7 illustrates a power distribution controller card cage 82 configured to receive the backplane insertable power switch circuit card assembly 60 shown in FIG. 6, according to one embodiment of the invention. Power distribution controller card cage 82 includes, among other things, lightning filters (not shown), EMI filters (not shown), and MIL connectors (not shown), according to one aspect of the invention.

Although particular EMI waveguide embodiments have been described herein, other embodiments may include, without limitation, plated circuit board through holes to create cutoff waveguides through which the optical waveguides can pass to and from the shielded EMI enclosure. Plated through holes may also be used to create cutoff waveguides around the periphery of each shielded EMI enclosure such that EMI fields cannot enter the shielded EMI enclosure through the circuit board material itself.

Figure 8:
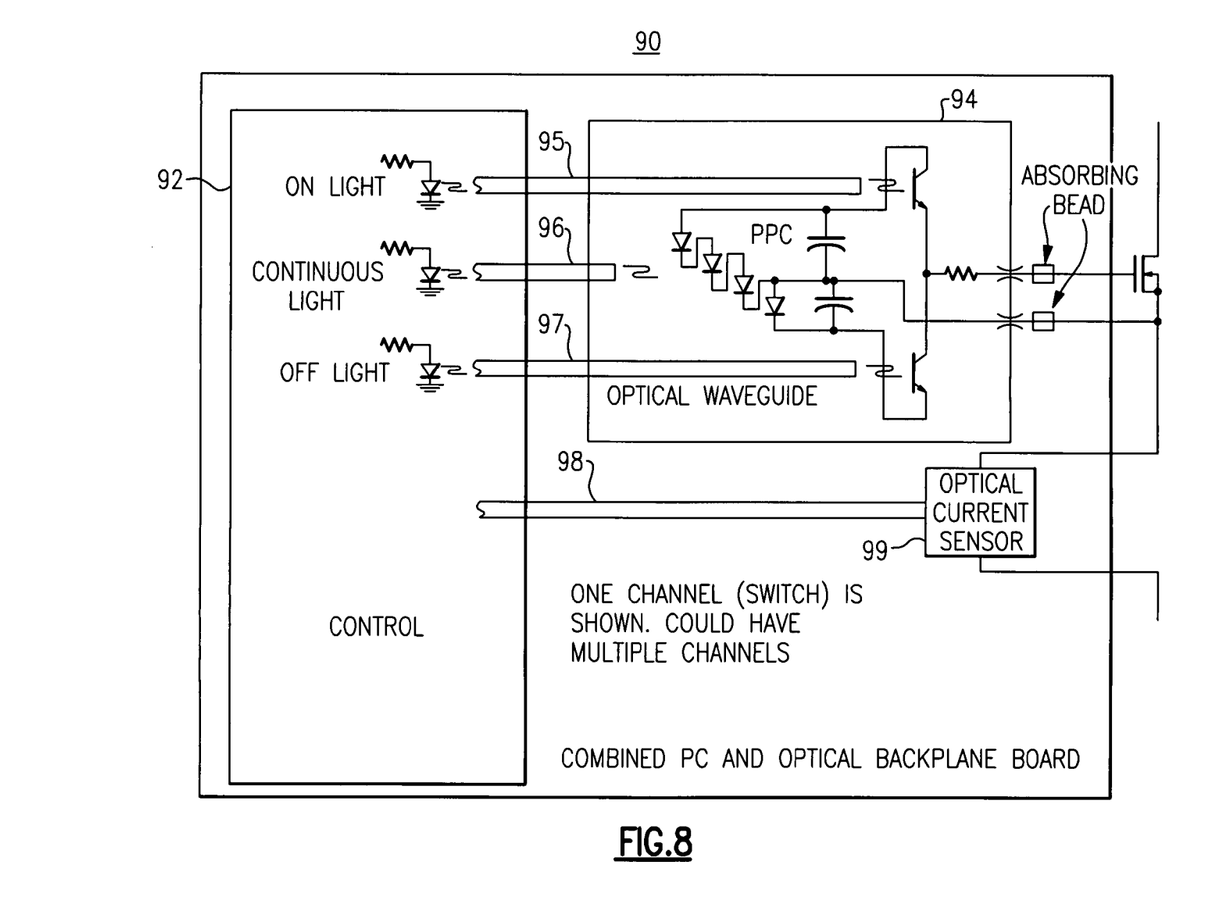
FIG. 8 is a simplified schematic diagram illustrating a combined power controller and optical backplane board that employs EMI waveguides and corresponding optical waveguides, according to one aspect of the invention.

FIG. 8 is a simplified schematic diagram illustrating a combined power controller and optical backplane board 90 that employs the EMI waveguide and optical waveguide principles described above, according to one aspect of the invention. The power control circuitry is disposed within a first shielded enclosure 92; while the corresponding gate drive circuitry is disposed within a second shielded enclosure 94. Plated through holes are used to create cutoff waveguides such as described above. Optical waveguides pass through the cutoff waveguides to provide interconnecting optical signal pathways 95, 96, 97, 98 between the power control circuitry shielded enclosure 92, the gate drive circuitry shielded enclosure 94, and an optical current sensor 99.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A circuit board assembly comprising:
at least one electro-magnetic (EM) waveguide configured to attenuate and prevent electro-magnetic fields below a cutoff frequency of about 40 GHz from interfering with operation of electro-magnetic interference (EMI) sensitive circuit board electronics below the desired cutoff frequency; and
at least one optical waveguide configured to pass optical signals transmitted to and from the EMI sensitive circuit board electronics, the optical signals passing through both the at least one optical waveguide and the at least one EM waveguide at frequencies below the cutoff frequency.

2. The circuit board assembly according to claim 1, further comprising at least one shielded enclosure configured to shield the EMI sensitive circuit board electronics from exposure to EMI.

3. The circuit board assembly according to claim 2, wherein the at least one shielded enclosure comprises at least one EM waveguide comprising at least one optical waveguide passing there through, the at least one optical waveguide configured to pass optical signals transmitted between the EMI sensitive circuit board electronics and electronics or devices external to the shielded enclosure.

4. The circuit board assembly according to claim 1, wherein the at least one optical waveguide comprises optical fiber.

5. The circuit board assembly according to claim 1, wherein the at least one optical waveguide comprises optically clear, electrically conductive material.

6. The circuit board assembly according to claim 1, wherein a plurality of optical waveguides are disposed within a single EM waveguide.

7. The circuit board assembly according to claim 1, further comprising at least one printed circuit board (PCB), the at least one PCB configured to shield the EMI sensitive circuit board electronics from exposure to EMI through the PCB, the at least one PCB comprising at least one optical waveguide configured to pass optical signals transmitted through the at least one PCB to and from the EMI sensitive circuit board electronics.

8. The circuit board assembly according to claim 7, wherein the at least one PCB further comprises at least one plated through hole configured as an EM waveguide through which the optical signals pass.

9. A circuit board assembly comprising:
at least one electro-magnetic (EM) waveguide, each EM waveguide configured to attenuate and prevent electro-magnetic fields below a desired cutoff frequency from interfering with operation of electro-magnetic interference (EMI) sensitive circuit board electronics below the desired cutoff frequency; and
a plurality of optical waveguides, each optical waveguide configured to pass optical signals transmitted to and from the EMI sensitive circuit board electronics, the optical signals passing through both the plurality of optical waveguides and at least one EM waveguide at frequencies below the desired cutoff frequency, wherein the plurality of optical waveguides are disposed within a single EM waveguide.

10. A circuit board assembly comprising:
at least one electro-magnetic (EM) waveguide, each EM waveguide configured to attenuate and prevent electro-magnetic fields below a desired cutoff frequency from interfering with operation of electro-magnetic interference (EMI) sensitive circuit board electronics below the desired cutoff frequency;
at least one optical waveguide, each optical waveguide configured to pass optical signals transmitted to and from the EMI sensitive circuit board electronics, the optical signals passing through both at least one optical waveguide and at least one EM waveguide at frequencies below the desired cutoff frequency; and
at least one printed circuit board comprising at least one plated through hole configured as an EM waveguide through which the optical signals pass.

11. A circuit board assembly comprising:
a printed circuit board (PCB) configured to prevent electro-magnetic (EM) fields from passing through the PCB;
at least one shielded enclosure disposed on the PCB and configured to shield electro-magnetic interference (EMI) susceptible PCB electronics disposed on the PCB from exposure to EMI;
at least one EM waveguide passing through at least one of the PCB or the at least one shielded enclosure and configured to attenuate and prevent EM fields below a desired cutoff frequency from interfering with operation of the EMI susceptible circuit board electronics disposed within the at least one shielded enclosure, wherein the at least one EM waveguide comprises a PCB plated through hole; and
at least one optical waveguide passing through at least one EM waveguide and configured to pass optical signals transmitted to and from the EMI susceptible circuit board electronics, the optical signals passing through both the at least one optical waveguide and the at least one EM waveguide at frequencies below the desired cutoff frequency.

12. A circuit board assembly comprising:
a printed circuit board (PCB) configured to prevent electro-magnetic (EM) fields from passing through the PCB;
at least one shielded enclosure disposed on the PCB and configured to shield electro-magnetic interference (EMI) susceptible PCB electronics disposed on the PCB from exposure to EMI;
at least one EM waveguide passing through at least one of the PCB or the at least one shielded enclosure and configured to attenuate and prevent EM fields below a cutoff frequency of about 40 GHz from interfering with operation of the EMI susceptible circuit board electronics disposed within the at least one shielded enclosure; and at least one optical waveguide passing through at least one EM waveguide and configured to pass optical signals transmitted to and from the EMI susceptible circuit board electronics, the optical signals passing through both the at least one optical waveguide and the at least one EM waveguide at frequencies below the desired cutoff frequency.

13. The circuit board assembly according to claim 12, wherein the at least one EM waveguide comprises a PCB plated through hole.

14. The circuit board assembly according to claim 12, wherein the at least one EM waveguide comprises opening dimensions configured to attenuate and prevent EM field frequencies below the desired cutoff frequency from passing there through.

15. The circuit board assembly according to claim 12, wherein the at least one optical waveguide comprises optical fiber.

16. The circuit board assembly according to claim 12, wherein the at least one optical waveguide comprises optically clear, electrically conductive material.

17. The circuit board assembly according to claim 12, wherein a plurality of optical waveguides are disposed within a single EM waveguide.

18. A circuit board assembly comprising:
a printed circuit board (PCB) configured to prevent electromagnetic (EM) fields from passing through the PCB;
at least one shielded enclosure disposed on the PCB and configured to shield electro-magnetic interference (EMI) susceptible PCB electronics disposed on the PCB from exposure to EMI;
at least one EM waveguide passing through at least one of the PCB or the at least one shielded enclosure and configured to attenuate and prevent EM fields below a desired cutoff frequency from interfering with operation of the EMI susceptible circuit board electronics disposed within the at least one shielded enclosure; and
a plurality of optical waveguides disposed within a single EM waveguide and configured to pass optical signals transmitted to and from the EMI susceptible circuit board electronics, the optical signals passing through both the plurality of optical waveguides and the single EM waveguide at frequencies below the desired cutoff frequency.

* * * * *